United States Patent
Suzuki et al.

(10) Patent No.: US 9,927,712 B2
(45) Date of Patent: Mar. 27, 2018

(54) SPATIAL LIGHT MODULATION ELEMENT MODULE, PHOTOLITHOGRAPHING APPARATUS, EXPOSURE APPARATUS, METHOD OF MANUFACTURING SPATIAL LIGHT MODULATION ELEMENT MODULE AND METHOD OF MANUFACTURING DEVICE

(71) Applicant: NIKON CORPORATION, Tokyo (JP)

(72) Inventors: Yoshihiko Suzuki, Funabashi (JP); Junji Suzuki, Tama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/155,453

(22) Filed: May 16, 2016

(65) Prior Publication Data

US 2016/0259252 A1   Sep. 8, 2016

Related U.S. Application Data

(63) Continuation of application No. PCT/JP2014/079945, filed on Nov. 12, 2014.

(30) Foreign Application Priority Data

Nov. 18, 2013   (JP) .................. 2013-238088

(51) Int. Cl.
   *G03F 7/20* (2006.01)
   *G02B 26/08* (2006.01)
   (Continued)

(52) U.S. Cl.
   CPC ...... *G03F 7/70191* (2013.01); *B81C 1/00317* (2013.01); *B81C 3/005* (2013.01);
   (Continued)

(58) Field of Classification Search
   None
   See application file for complete search history.

(56) References Cited

U.S. PATENT DOCUMENTS 5,497,258 A * 3/1996 Ju .................. G02F 1/13452
                                                    349/149
2003/0174035 A1   9/2003 Arima
(Continued)

FOREIGN PATENT DOCUMENTS

JP   2003-098445 A   4/2003
JP   2003-270558 A   9/2003
(Continued)

OTHER PUBLICATIONS

Jan. 20, 2015 Search Report issued in International Patent Application No. PCT/JP2014/079945.
(Continued)

*Primary Examiner* — Steven H Whitesell Gordon
(74) *Attorney, Agent, or Firm* — Oliff PLC

(57) ABSTRACT

A spatial light modulation element module having a large area is manufactured. A spatial light modulation element module comprising a base member and a plurality of spatial light modulation element arrays, wherein each of the plurality of spatial light modulation element arrays has a light modulation element which modulates and emits at least one of the intensity and the phase of an incident light, and the base member maintains the plurality of spatial light modulation element arrays in a predetermined relative position in a bare chip state. In the above-described spatial light modulation element module, the plurality of spatial light modulation element arrays may be in a staggered arrangement in at least 1 direction.

10 Claims, 12 Drawing Sheets

(51) Int. Cl.
 *B81C 1/00* (2006.01)
 *B81C 3/00* (2006.01)
 *G02B 26/02* (2006.01)
 *G02B 26/06* (2006.01)
 *G02B 5/00* (2006.01)

(52) U.S. Cl.
 CPC ............ *G02B 26/02* (2013.01); *G02B 26/06* (2013.01); *G02B 26/0833* (2013.01); *G02B 26/0841* (2013.01); *G03F 7/70291* (2013.01); *B81B 2201/042* (2013.01); *B81B 2207/012* (2013.01); *B81C 2203/054* (2013.01); *G02B 5/003* (2013.01)

(56) References Cited

U.S. PATENT DOCUMENTS

| | | | | |
|---|---|---|---|---|
| 2003/0210383 | A1* | 11/2003 | Bjorklund | G03F 7/70291 355/53 |
| 2006/0066820 | A1* | 3/2006 | Kimura | G03B 21/28 353/99 |
| 2006/0187428 | A1* | 8/2006 | Bleeker | G03F 7/70291 355/53 |
| 2006/0285193 | A1 | 12/2006 | Kimura et al. | |
| 2007/0069356 | A1 | 3/2007 | Yoda et al. | |
| 2008/0231826 | A1* | 9/2008 | Desmedt | G03F 7/70283 355/53 |
| 2009/0009732 | A1* | 1/2009 | Maeda | G02B 26/0841 353/99 |
| 2009/0190201 | A1 | 7/2009 | Ohara | |

FOREIGN PATENT DOCUMENTS

| | | |
|---|---|---|
| JP | 2006-337858 A | 12/2006 |
| JP | 2007-052080 A | 3/2007 |
| JP | 2007-094049 A | 4/2007 |
| JP | 2009-180905 A | 8/2009 |

OTHER PUBLICATIONS

Sandstrom, Tor et al; "Optical Maskless Lithography for Economic Design Prototyping and Small-Volume Production"; Proc. of SPIE vol. 5377; pp. 777-787.

* cited by examiner

SPATIAL LIGHT MODULATION ELEMENT MODULE, PHOTOLITHOGRAPHING APPARATUS, EXPOSURE APPARATUS, METHOD OF MANUFACTURING SPATIAL LIGHT MODULATION ELEMENT MODULE AND METHOD OF MANUFACTURING DEVICE

The contents of the following Japanese and International patent applications are incorporated herein by reference:

NO. 2013-238088 filed on Nov. 18, 2013, and

NO. PCT/JP2014/079945 filed on Nov. 12, 2014.

BACKGROUND

1. Technical Field

The present invention relates to a spatial light modulation element module, a photolithographing apparatus, an exposure apparatus, a method of manufacturing a spatial light modulation element module, and a method of manufacturing a device.

2. Related Art

There exists an exposure apparatus comprising a drawing head which includes a spatial light modulation element (for example, refer to Patent document 1 and Non-Patent document 1).

Patent document 1: Japanese Patent Application Publication No. 2007-052080

Non-Patent document 1: Proc. of SPIE Vol. 5377, p. 777

SUMMARY

If a spatial light modulation element is increased in size, the yield rate of manufacturing significantly drops.

In a first aspect of the present invention, a spatial light modulation element module comprising a base member and a plurality of spatial light modulation element arrays, wherein each of the plurality of spatial light modulation element arrays has a light modulation element which modulates at least one of the intensity and phase of an incident light and emits, and the base member maintains the plurality of spatial light modulation element arrays in a bare chip state in predetermined relative positions, is provided.

In a second aspect of the present invention, a photolithographing apparatus which draws a light figure using the above-described spatial light modulation element module is provided.

In a third aspect of the present invention, an exposure apparatus which exposes an object using the above-described photolithographing apparatus is provided.

In a fourth aspect of the present invention, a method of manufacturing a spatial light modulation element module comprising a step of preparing a plurality of spatial light modulation element arrays, each having a plurality of reflecting elements, and a step of arranging each of a plurality of spatial light modulation elements along the base member is provided.

In a fifth aspect of the present invention, a method of manufacturing a device, including a lithography process, in which the above-described exposure apparatus is used to perform exposure is provided.

The above-described outline of the invention does not list all of the features of the present invention. A sub-combination of these features can also be an invention.

DESCRIPTION OF EXEMPLARY EMBODIMENTS

In the following, the present invention is explained through embodiments of the invention. However, the following embodiments do not limit the scope of the invention according to the claims. Also, not all of the combinations of the features explained in the embodiments are necessary in solving the problems of the invention.

Figure 1:
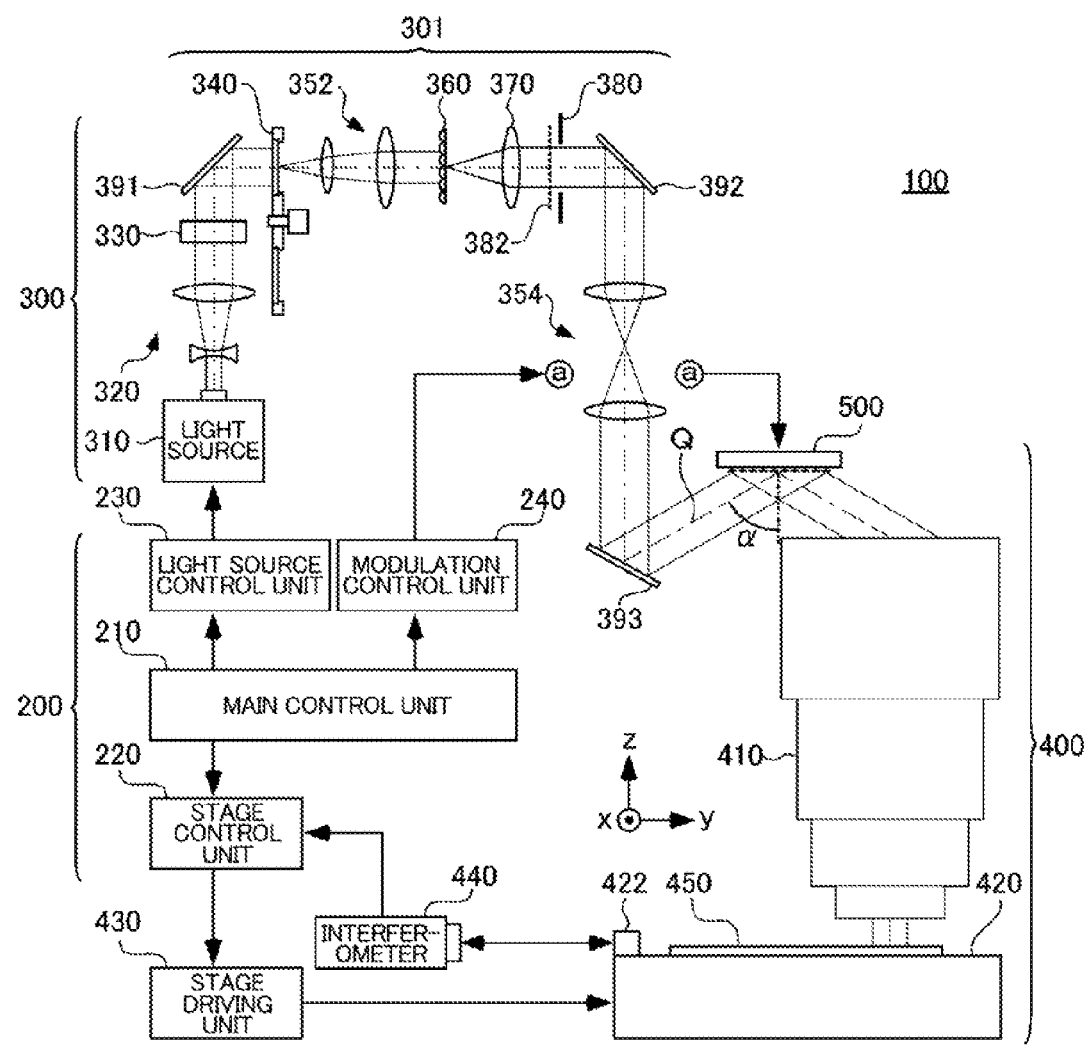
FIG. 1 is a schematic view of an exposure apparatus 100.

FIG. 1 is a schematic view indicating the structure of an exposure apparatus 100. The exposure apparatus 100 comprises a control system 200, an illumination system 300, and a photolithographing system 400. The photolithographing system 400 includes a spatial light modulation element module 500.

The control system 200 has a main control unit 210, a stage control unit 220, a light source control unit 230, and a modulation control unit 240. The stage control unit 220 controls a stage driving unit 430, a light source control unit 230 controls a light source 310, a modulation control unit 240 controls a spatial light modulation element module 500, respectively and individually.

In contrast, the main control unit 210 collectively controls the entire exposure apparatus 100 including the stage control unit 220, the light source control unit 230, and the modulation control unit 240. Also, the main control unit 210 has an interface for a user and accepts instructions from the user as well as notifying the outside of the exposure apparatus 100 of an operative state of the exposure apparatus 100.

The illumination system 300 has a light source 310 and an optical system 301. A trigger pulse that instructs a timing of light emission and the light emission intensity is fed from the light source control unit 230 to the light source 310, and the light source 310 emits light pulses. A pulsed light generated by the light source 310 is approximately a parallel light flux and has a rectangular cross-section shape of a beam.

For the light source 310, a wavelength-conversion-type solid state laser which emits light pulses at a frequency of about 1-3 MHz, of a laser beam with a wavelength 193 nm and a pulse width about 1 ns, etc., for example, can be used. Also, for the light source 310, an ArF excimer laser which emits light pulses at a frequency of about 4-6 kHz, of a laser beam with a wavelength 193 nm and a pulse width about 50 ns, a KrF excimer laser which emits light at a wavelength 248 nm, a light emitting diode which is lit in pulses, etc. can be used.

The optical system 301 comprises optical members such as a beam expander 320, a polarization control optical element 330, a diffraction optical element 340, a relay optical system 352, 354, a micro-lens array 360, a relay lens, and a field stop 380. The beam expander 320 enlarges a beam diameter of a pulsed light generated by the light source 310.

The polarization control optical element 330 in the optical system 301 controls a polarization state of the pulsed light. For the polarization control optical element 330, a ½ wavelength plate which rotates the polarizing direction of the pulsed light, a ¼ wavelength plate which converts the pulsed light to a circular polarized light, and a birefringence prism which converts the pulsed light to a random polarized light (non-polarized light), etc. are properly selected and arranged.

In the diffraction optical element 340 in the optical system 301, one of a plurality of elements maintained at the turret is inserted into the optical path of the pulsed light. For the diffraction optical element 340, a small-σ illumination element which produces an illumination light with a small coherence factor (σ value), a 2-pole illumination element, a 4-pole illumination element, an annular illumination element, etc. in addition to a typical illumination element. For the diffraction optical element 340, a spatial modulation element of reflecting type can also be used.

In the optical system 301, a pulsed light emitted from the diffraction optical element 340 is guided to a micro-lens array 360 by the relay optical system 352. The micro-lens array 360 in the optical system 301 two-dimensionally divides the pulsed light with many micro lens elements and forms a secondary light source (a surface light source) on an illumination pupil plane of the optical system 301, which is also a rear focal plane. A zoom lens may be used for the relay optical system 352. Also, a fly-eye lens may be used for the micro-lens array 360.

An illumination light emitted from the secondary light source formed on the illumination pupil plane is irradiated toward the spatial light modulation element module 500 through a relay lens 370, the field stop 380, and the other relay optical system 354. The field stop 380 is provided in a position which is shifted in the optical axis direction from a plane conjugate with an object plane of the projection optical system 410, COP 382.

An illumination light irradiated onto the spatial light modulation element module 500 illuminates a rectangular-shaped region that is elongate in the x-direction among the directions indicated by arrows in the figure with an approximately uniform illuminance. Also, the illumination light is incident on a reflective surface of the spatial light modulation element module 500 at an incident angle α having a predetermined certain tilt.

The optical system 301 further includes a plurality of reflecting mirror 391, 392, 393 inserted onto the optical path. The reflecting mirror 391, 392, 393 make the exposure apparatus 100 compact by bending the optical path of the illumination light.

The photolithographing system 400 includes the spatial light modulation element module 500, the projection optical system 410, and a wafer stage 420. The spatial light modulation element module 500 forms an illuminance distribution of an illumination light irradiated with a uniform illuminance under the control of the modulation control unit 240. As for the spatial light modulation element module 500, it will be described later by referring to other figures.

The projection optical system 410 is non-telecentric on the side of the spatial light modulation element module 500 and forms a reduced projection optical system that is telecentric on the side of the wafer stage 420. Also, the spatial light modulation element module 500 and a surface of the semiconductor wafer 450 mounted on the wafer stage 420 are positioned in a conjugated relationship relative to the projection optical system 410.

Thereby, the projection optical system 410 forms a reduced image of a spatial image having a distribution formed by the spatial light modulation element module 500 on the surface of the semiconductor wafer 450, and exposes a resist film applied on the semiconductor wafer 450 to light. The semiconductor wafer 450 may be a compound semiconductor, etc. in addition to single crystal silicon.

The projection optical system 410 has, for example, a projection magnification β of about $1/10$-$1/100$. Also, the resolution of the projection optical system 410 is, for example, about one to several times the resolution of the spatial light modulation element module 500. In other words, the resolution of the projection optical system 410 can be improved by improving the resolution of the spatial light modulation element module 500.

Now, the control system 200, the illumination system 300, the spatial light modulation element module 500, and the projection optical system 410 are respectively fixed relative to the exposure apparatus 100. In contrast, the wafer stage 420 is driven by the stage driving unit 430 and displaced in the scanning direction y indicated by an arrow in the figure. Thereby, the surface of the semiconductor wafer 450 can be scanned by a projected light emitted from the projection optical system 410.

The wafer stage 420 also mounts the reflecting mirror 422. The reflecting mirror 422 has a reflective surface orthogonal to the moving direction of the wafer stage 420 and reflects a laser beam irradiated from an interferometer 440 toward the interferometer 440. Thereby, the stage control unit 220 precisely detects a moving amount of the wafer stage 420 and controls the stage driving unit 430 with a high precision.

In this manner, in the exposure apparatus 100, the semiconductor wafer 450 can be exposed to light by a projected light with a pattern formed in a maskless manner without using a mask or reticle. Also, by moving the wafer stage 420, the entire surface of the semiconductor wafer 450 can be exposed to light.

Thus, by repeating the lithographic exposures, many exposure patterns can be formed on the surface of the semiconductor wafer 450. Also, by changing the pattern for every shot, a pattern larger than the projected area of the projection optical system 410 can be formed on the semiconductor wafer 450. In addition, a different pattern can also be formed depending on the region of the semiconductor wafer 450.

Figure 2:
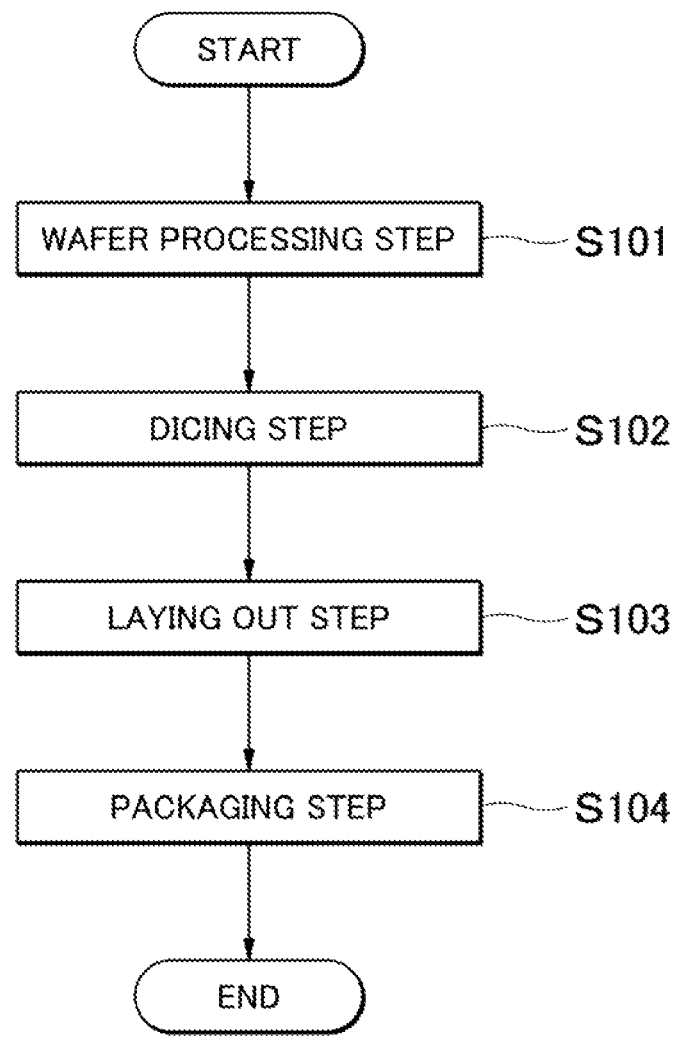
FIG. 2 is a flow diagram showing a process of manufacturing of the spatial light modulation element module.

FIG. 2 is a flow diagram indicating a process of manufacturing the spatial light modulation element module 500. The spatial light modulation element module 500 can be manufactured by processing a silicon wafer by MEMS (Micro Electro Mechanical Systems) technique. Then, in the manufacturing of the spatial light modulation element module 500, a wafer process step (step S101) which processes the silicon wafer by the photolithography technique is performed at first.

Figure 3:
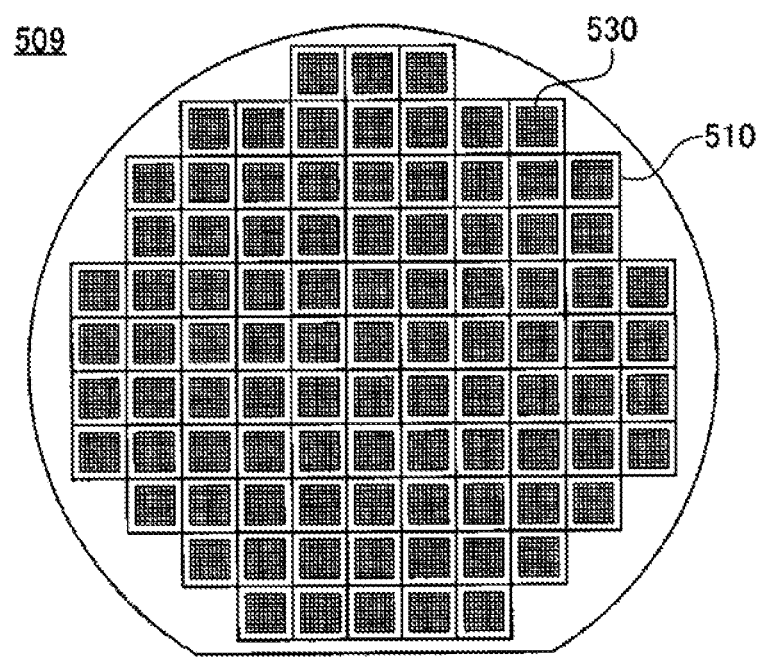
FIG. 3 is a plan view of a silicon wafer 509.

FIG. 3 is a figure schematically showing a silicon wafer 509 on which a plurality of spatial light modulation element arrays 510 are formed by the wafer process. As illustrated in the figure, the plurality of spatial light modulation element arrays 510 are formed on a single slice of silicon wafer 509 by the wafer process. Also, many reflecting elements 530 which determine the resolution of the spatial light modulation element array 510 are formed in the individual spatial light modulation element array 510.

When a silicon wafer 509 with a diameter 30 cm is used, the individual spatial light modulation element array 510 becomes the size of, for example, about 2.5 square cm. Also, each one of the reflecting elements 530 made in the spatial light modulation element array 510 has, for example, a rectangular shape with the length of a side about several μm.

Here, the resolution of the spatial light modulation element array 510 alone can be improved by increasing the size of the spatial light modulation element array 510 individually. However, the yield rate of the spatial light modulation element array 510 drops if the number of the reflecting elements 530 to be made in one spatial light modulation element array 510 is increased. For this reason, an efficiency of utilizing the silicon wafer 509 can be improved even in the case where the yield rate of the reflecting element 530 does not change, by suppressing the resolution of the individual spatial light modulation element array 510.

Referring to FIG. 2 again, a dicing step (step S102) is performed in which the spatial light modulation element array 510 is divided by dicing the silicon wafer 509 in which the plurality of spatial light modulation element array 510 is manufactured in step S101. The silicon wafer 509 can be diced also by a mechanical process using a dicing saw in addition to the laser process. By doing this, many spatial light modulation element arrays 510 can be prepared.

Figure 4:
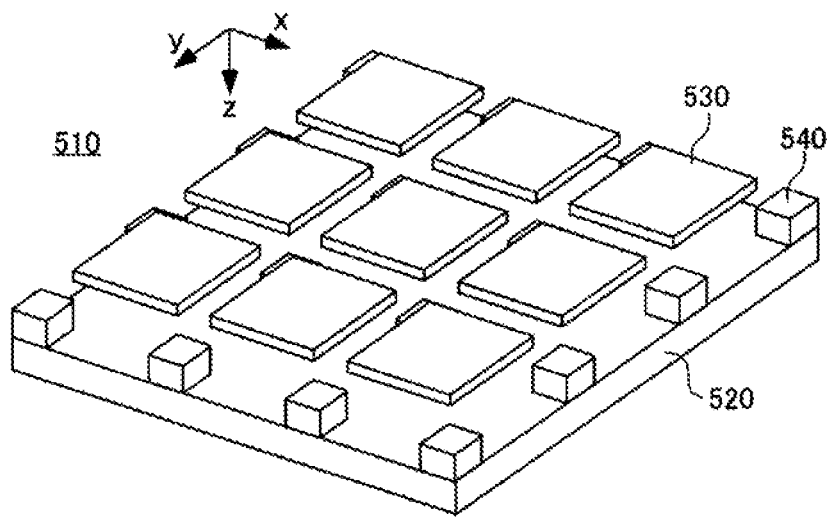
FIG. 4 is a schematic perspective view of the spatial light modulation element array 510.

FIG. 4 is a schematic perspective view indicating the structure of the spatial light modulation element array 510 alone. As illustrated in the figure, the spatial light modulation element array 510 has an array substrate 520, a plurality of reflecting elements 530 and a plurality of posts 540 arranged on the array substrate 520.

The posts 540 are orderly arranged in a matrix form on the array substrate 520. The post 540 displaceably supports the reflecting element 530 as described later. The reflecting element 530 is arranged in a matrix form having a constant relative position relative to the post 540. Also, a surface of the reflecting element 530 is arranged on a common plane which is parallel to a surface of the array substrate 520.

Figure 5:
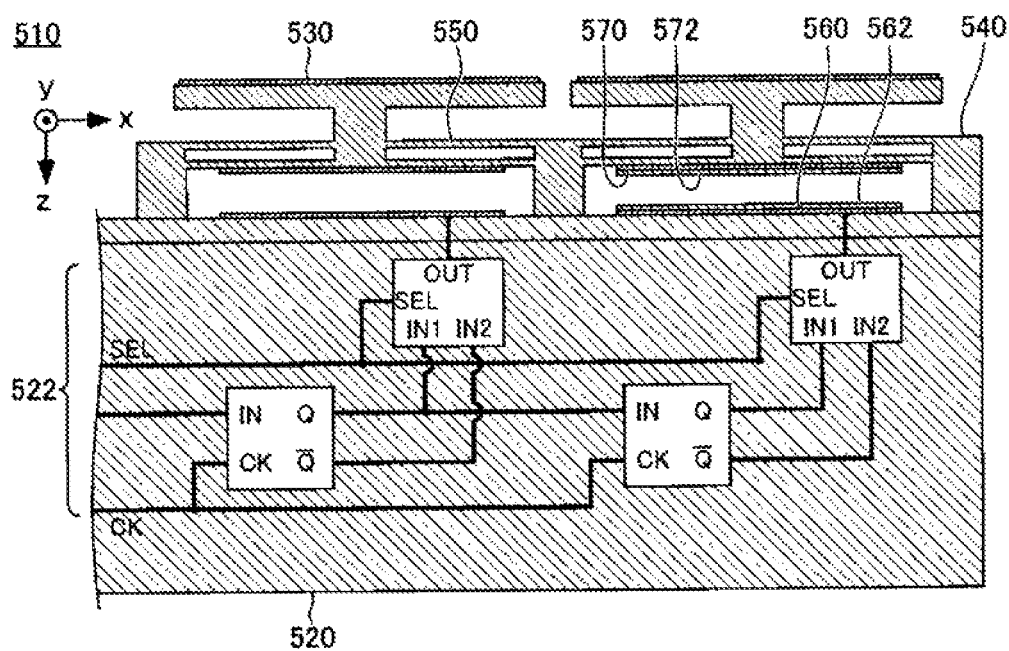
FIG. 5 is a schematic cross-sectional view of the spatial light modulation element array 510.

FIG. 5 is a schematic cross-sectional view of the spatial light modulation element array 510. In the cross-section illustrated in the figure, it is indicated that the post 540 and the reflecting element 530 are elastically coupled by a flexure 550 on the surface of the array substrate 520.

Also, in the cross-section illustrated in the figure, a fixed electrode 560 and a movable electrode 570 are respectively arranged on a top surface in the figure of the array substrate 520 and on a lower surface in the figure of the flexure 550. In the fixed electrode 560 and the movable electrode 570, insulation films 562, 572 are formed on at least a portion of the surfaces opposite to each other. Thereby, the fixed electrode 560 and the movable electrode 570 are prevented from shorting each other.

Furthermore, in the cross-section illustrated in the figure, a CMOS circuit 522 is arranged inside the array substrate 520.

The CMOS circuit 522 includes a flip-flop and a selected circuit corresponding to each one of the fixed electrode 560.

In the CMOS circuit 522, when any of the selected circuits is selected, voltage is applied to the corresponding fixed electrode 560 at the timing of a clock signal fed into the flip-flop.

The movable electrode 570 is connected to some fixed potential, for example, ground potential. Also, a wiring, a via, a pad, a bump, etc. which connect the CMOS circuit 522 to outside are provided in the array substrate 520.

In the spatial light modulation element array 510 as described above, the CMOS circuit 522 can be formed by processing the silicon wafer 509 by a CMOS process. Also, a structure such as the reflecting element 530, the post 540, the flexure 550, etc. is formed by silicon nitride deposited on the silicon wafer 509, polysilicon, etc. Moreover, a metal layer such as aluminum may be deposited on the surface of the reflecting element 530 for the purpose of improving the reflection efficiency.

Figure 6:
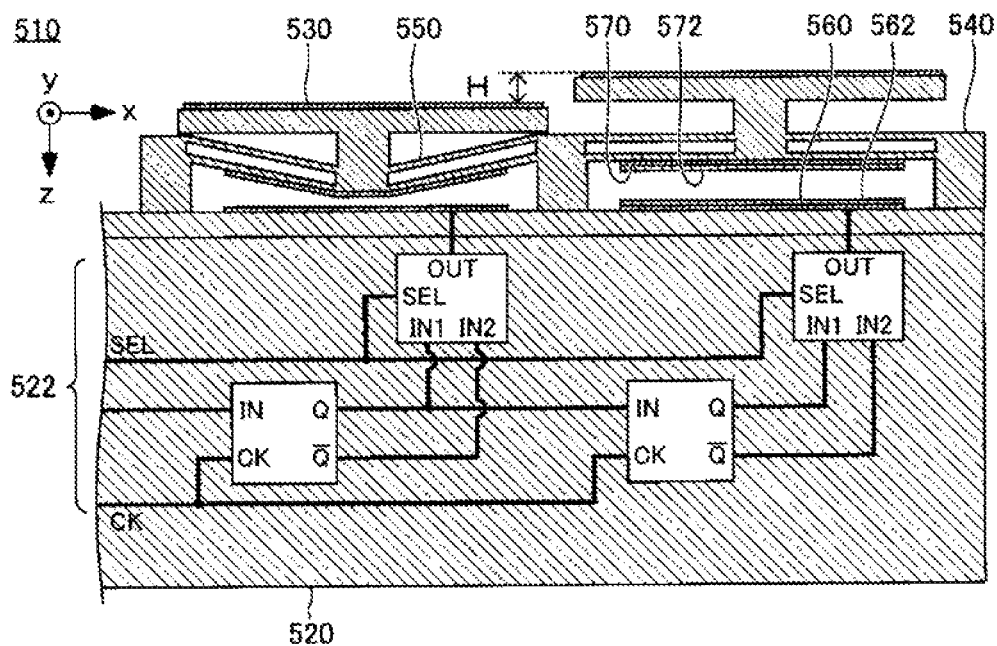
FIG. 6 is a schematic cross-sectional view of the spatial light modulation element array 510.

FIG. 6 shows a state in which voltage is applied to one fixed electrode 560 in the spatial light modulation element array 510 shown in FIG. 5. Namely, the voltage is applied to the fixed electrode 560 positioned at the left side in the figure, and the opposite movable electrode 570 is attracted in the lower direction in the figure. Thereby, the flexure 550 is deformed and the reflecting element 530 is displaced in the lower direction in the figure. Thus, a difference in height H arises with the reflecting element 530 on the right side in the figure to which the voltage is not applied.

Figure 7:
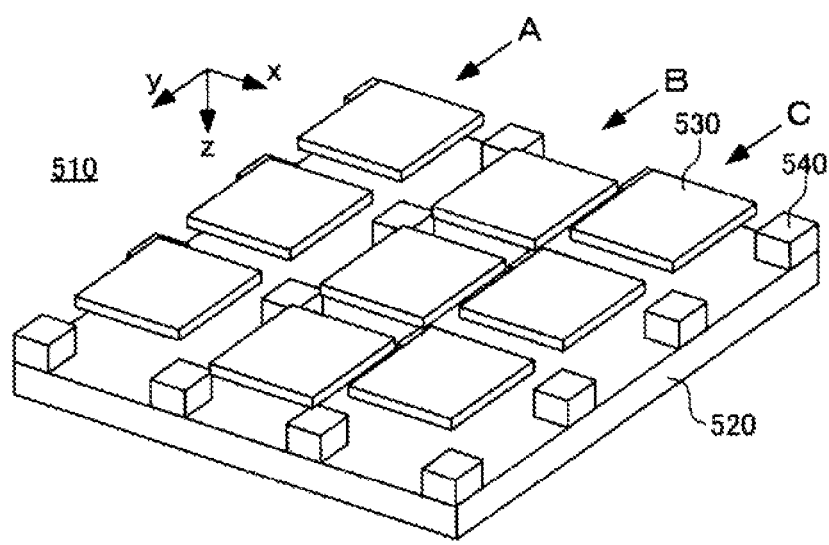
FIG. 7 is a schematic perspective view of the spatial light modulation element array 510.

FIG. 7 is, as described above, a perspective view showing a condition of the spatial light modulation element array 510 in which the voltage is applied to some fixed electrodes 560. In the illustrate example, the reflecting elements 530 in the row A on the left side in the figure and the row C on the right side in the figure are maintaining the same state as the spatial light modulation element array 510 shown in FIG. 4. In contrast, the reflecting element 530 in the row B which is positioned at the center in the figure is displaced in the direction in which it is approaching the array substrate 520 relative to the initial array plane shown with a dotted line in the figure.

In ease a projected light is incident on the spatial light modulation element array 510, the optical path of a reflected light is also displaced due to the displacement of the reflecting element 530 as described above. Also, a phase of the reflected light emitted toward outside changes with the displacement of the optical path. In this manner, in the spatial light modulation element array 510, the state of the reflected light can be changed for every reflecting element 530 by individually controlling the plurality of reflecting elements 530 provided.

For example, in case the phase of the reflected light in the reflecting element 530 changes, a light intensity of the reflected light in a region including the reflecting element 530 in the spatial light modulation element array 510 changes due to a mutual effect of the reflected light in the reflecting element 530 and the reflected light that is reflected in the region between the mutual reflecting elements 530. Thereby, a distribution of an illumination light reflected by the spatial light modulation element array 510 can be formed.

Figure 8:
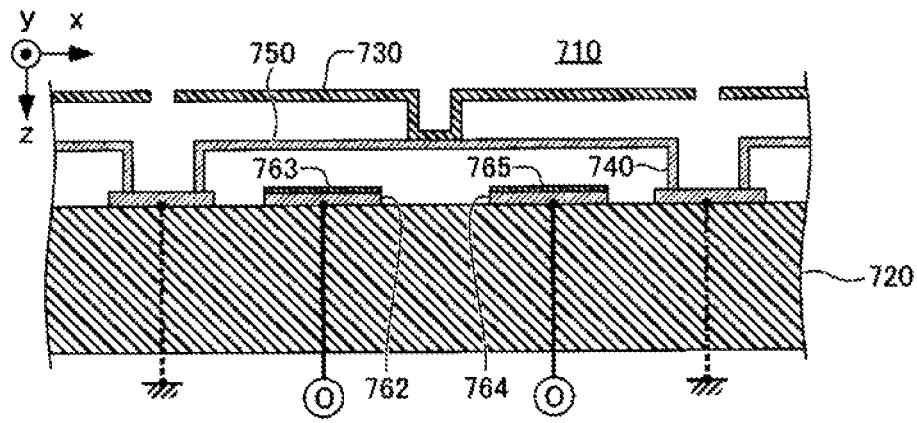
FIG. 8 is a schematic cross-sectional view of a spatial light modulation element array 710.

FIG. 8 is a schematic cross-sectional view showing the other spatial light modulation element array 710 which may form the spatial light modulation element module 500 in place of the spatial light modulation element array 510. The spatial light modulation element array 710 comprises an array substrate 720, a reflecting element 730, a post 740, and a flexure 750.

The array substrate 720 has a pair of fixed electrodes 762, 764 arranged on the top surface in the figure. Surfaces of the fixed electrodes 762, 764 are covered by insulation films 763, 765.

The reflecting element 730 is supported from the post 740 via the flexible flexure 750.

Here, the pair of the fixed electrodes 762, 764 are distributed and arranged in the direction of the plane of the array substrate 720 relative to the reflecting element 730. Also, driving voltage can be individually applied to each of the fixed electrodes 762, 764.

Figure 9:
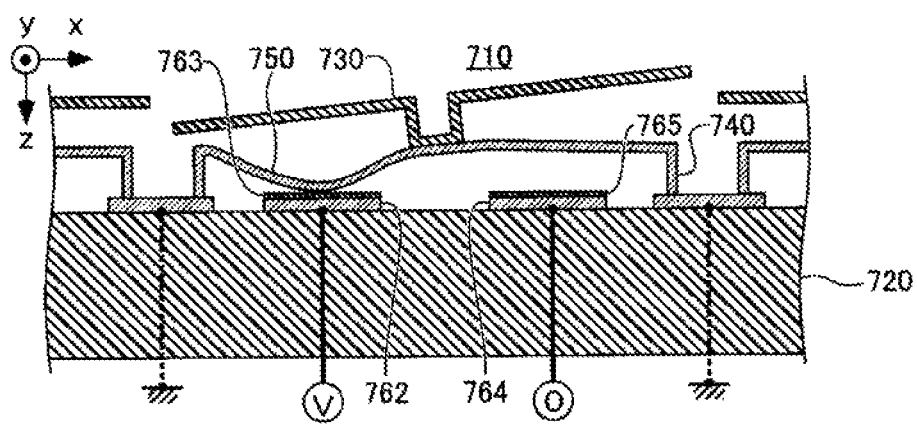
FIG. 9 is a schematic cross-sectional view of the spatial light modulation element array 710.

FIG. 9 is a figure explaining the operation of the spatial light modulation element array 710. When the spatial light modulation element array 710 is operated, the driving voltage is applied to either one of the fixed electrodes 762, 764 as illustrated in the figure. In the example illustrated in the figure, the driving voltage is applied to the fixed electrode 762 positioned on the left side in the figure.

The flexure 750 is constantly connected to the reference potential.

As the driving voltage is applied to the fixed electrode 762, the flexure 750 is adsorbed on the fixed electrode 762 due to an electrostatic force generated between the flexure 750 and the fixed electrode 762, tilting the reflecting element 730 supported by the flexure 750. Thereby, the propagating direction of the reflected light reflected by the reflecting element 730 changes, and thus the spatial light modulation element array 710 can modulate the incident light.

The flexure 750 adsorbed on the fixed electrode 762 positions the tilt of the reflecting element 730 by abutting on the fixed electrode 762. At this time, the insulation film 763 provided on the surface of the fixed electrode 762 prevents the shorting of the fixed electrode 762 and the flexure 750.

Referring to FIG. 2 again, a laying out step (step S103) in which the spatial light modulation element array assembling body 610 is made is performed in manufacturing of the spatial light modulation element module 500. In the laying out step, a plurality of spatial light modulation element arrays 510 are implemented in a module substrate 580. The module substrate 580 can be formed by, for example, a silicon substrate.

Figure 10:
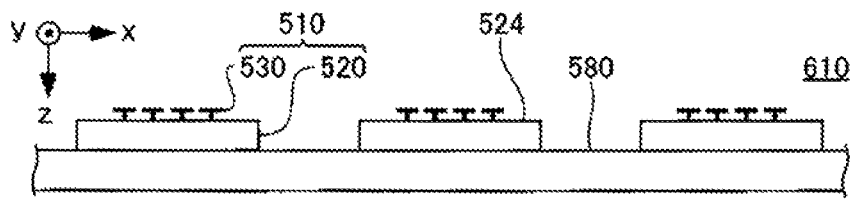
FIG. 10 is a schematic side view of a spatial light modulation element array assembling body 610.

FIG. 10 is a schematic side view of the spatial light modulation element array assembling body 610. As illustrated in the figure, the plurality of spatial light modulation element arrays 510 are positioned and fixed on the module substrate 580 as the base member. Thereby, the mutual position of the plurality of spatial light modulation element arrays 510 is fixed. For fixing the spatial light modulation element arrays 510 relative to the module substrate 580, metal junction, an organic adhesive, an inorganic adhesive such as liquid glass, anodic bonding, etc. can be broadly utilized.

Before permanently fixing the spatial light modulation element arrays 510 to the module substrate 580 by hardening the adhesive, etc., the individual spatial light modulation element array 510 may be inspected. The yield rate of the spatial light modulation element module 500 can be further improved by inspecting and replacing the damaged spatial light modulation element array 510 with a normal one in this step.

Also, in each of the spatial light modulation element arrays 510, the reflecting element 530 is displaceably provided relative to the array substrate 520. For this reason, there is a possibility that the property of the flexible structure of the flexure 550, etc. is changed if tools such as a chuck, a delivery robot, tweezers, etc. contact the reflecting element 530 in the process to fix the spatial light modulation element array 510.

Then, in the example illustrated in the figure, a handling region 524 in which the reflecting element 530 is not arranged is provided in the periphery of the array substrate 520 in each of the spatial light modulation element arrays 510. Thereby, the spatial light modulation element array 510 can be handled without contacting the reflecting element 530 when handling the spatial light modulation element array 510.

In this manner, in the spatial light modulation element array assembling body 610, the spatial light modulation element array 510 is implemented in a bare chip state relative to the module substrate 580. That is, each of the spatial light modulation element arrays 510 implemented in the module substrate 580 does not comprise an individual package, etc., and maintains the state in which it is diced from the silicon wafer 509 in the dicing step (step S102). Thereby, the spatial light modulation element arrays 510 can be implemented relative to the module substrate 580 with a high density. Thus, a resolution enhancement of the spatial light modulation element module 500 can be performed with a small number of components.

Furthermore, before implementing in the module substrate 580, the efficiency of utilizing the silicon wafer 509 can be improved by sorting the spatial light modulation element arrays 510. Also, the spatial light modulation element module 500 which does not have any defect despite of a large number of pixels can be manufactured by selecting and implementing the spatial light modulation element array without a defect.

However, in a case where the handling region 524 is provided in the array substrate 520, the area of the spatial light modulation element array 510 becomes broader than the region where the reflecting element 530 is arranged. For this reason, the proportion of the area occupied by the reflecting element 530 in the module substrate 580 decreases by the portion of the handling region 524.

Figure 11:
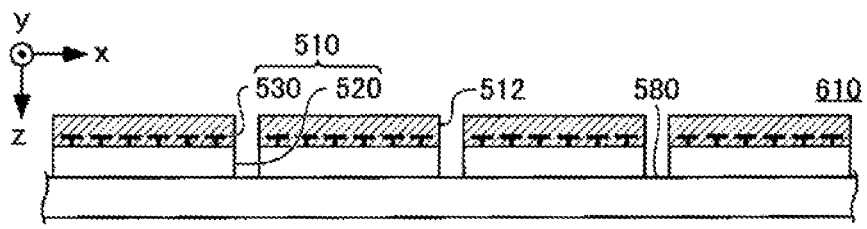
FIG. 11 is a schematic side view of the spatial light modulation element array assembling body 610.

FIG. 11 is a figure explaining another aspect of the laying out step (step S103). In the example illustrated in the figure, each of the spatial light modulation element arrays 510 implemented in the module substrate 580 has a sacrifice layer 512 in which the reflecting element 530 is embedded. Thereby, the spatial light modulation element array 510 can be handled without contacting the reflecting element 530 even if the reflecting elements 530 are arranged on the entire surface of the array substrate 520.

Thus, the fraction of the area of the reflecting element 530 in each of the spatial light modulation element arrays 510 can be increased by providing the sacrifice layer 512 in the spatial light modulation element array 510 before the laying out step (step S103) in which the spatial light modulation element array 510 is arrayed. Also, by adsorbing and handling the top surface of the sacrifice layer 512 with vacuum tweezers, etc., the spacing of the spatial light modulation element arrays 510 on the module substrate 580 is made narrow, and the packaging density can be increased.

The sacrifice layer 512 can be formed by, for example, a resist used in a wafer process, silicon oxide, etc. Also, the sacrifice layer 512 is removed after the spatial light modulation element array 510 is implemented on the module substrate 580. While the sacrifice layer 512 can be removed by dry etching or wet etching using HF, $XeF_2$, etc., an etchant which does not degrade the adhesive fixing the spatial light modulation element array 510 on the module substrate 580 is selected and used.

Furthermore, the sacrifice layer 512 may utilize those formed in the semiconductor process step (step S101) or may provide anew in the spatial light modulation element array 510 in the laying out step (step S103). However, the procedure can be reduced more by forming the sacrifice layer 512 before dicing the spatial light modulation element array 510 than providing the sacrifice layer 512 on an individual chip. Thus, it is preferable to form the sacrifice layer 512 before the dicing step (step S103).

Figure 12:
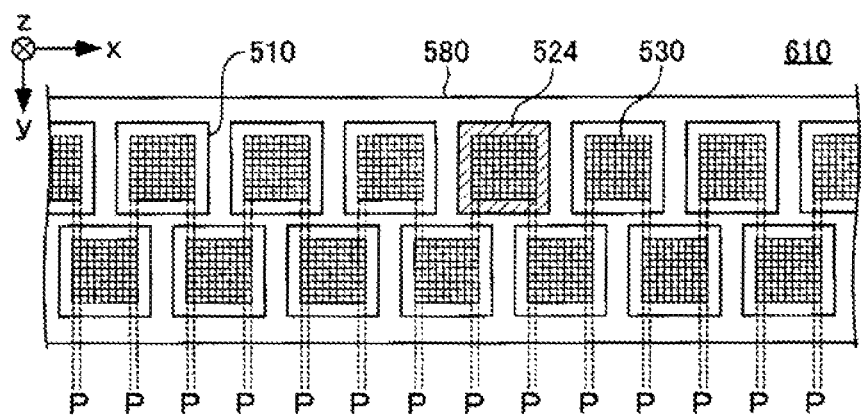
FIG. 12 is a schematic plan view of the spatial light modulation element array assembling body 610.

FIG. 12 is a plan view of the spatial light modulation element array assembling body 610. As illustrated in the figure, the spatial light modulation element array 510 is laid out in two lines horizontally in the figure in the module substrate 580.

Here, the spatial light modulation element array 510 arrayed in the upper stage in the figure and the spatial light modulation element array 510 arrayed in the lower stage in the figure mutually form a staggered arrangement in which they are alternatingly arranged at a half position of the array pitch. Also, the spacing of the spatial light modulation element arrays 510 in each line has a pitch in which the reflecting elements 530 on both ends of the spatial light modulation element array 510 overlap with each other on top and bottom in the figure in the direction horizontal in the figure, as shown with dotted lines P in the figure.

Thereby, in the spatial light modulation element array assembling body 610, the reflecting elements 530 are arranged with no space between in the direction that is orthogonal to the scanning direction in the exposure apparatus 100 shown by the arrow y in the figure. Thus, when using the spatial light modulation element module 500 in the exposure apparatus 100, the resolution in the direction that is orthogonal to the scanning direction y can be increased.

In order to increase the throughput in the exposure apparatus 100, increasing the number of pixels of the spatial light modulation element module 500 is first considered. This is applicable in the x-direction without ally modification, and the throughput increases by the amount of the increased number of pixels. However, for the y-direction, the scanning velocity of the stage, repeating frequency of the laser, the amount of exposure required to complete the exposure, etc. are mutually relevant, so even if the number of pixels is increased, it is not simply reflected in the throughput. Thus, there are cases when the number of pixels in the y-direction is determined rather by these parameters. Also, the throughput in the exposure apparatus 100 can be effectively increased by increasing the pixel count in the x-direction after the number of pixels in the y-direction is determined.

Also, increasing the number of pixels in the x-direction is effective in order to increase the throughput as described above. However, when manufacturing the spatial light modulation element module 500 from a circular silicon wafer, a chip that is elongated only in the x-direction decreases the number of imposition that is the number of chips which can be obtained from one wafer. Also, the yield rate drops more rapidly as the size of a single chip increases. In contrast, the number of pixels in the x-direction in the spatial light modulation element module 500 can be increased without causing the above-described problem, by further arranging the plurality of spatial light modulation element arrays 510 manufactured as chips with a well-balanced aspect ratio.

However, there are regions where the reflecting element 530 is not arranged in the individual chips of the spatial light modulation element array 510. For this reason, when arranging the chips of the plurality of spatial light modulation element arrays 510, a section where the reflecting element 530 does not exist is generated even if the chips are mutually arrayed face-to-face. In contrast, as shown in FIG. 12, the spatial light modulation element module 500 in which the reflecting elements 530 are finely arranged can be formed by providing a plurality of lines of the spatial light modulation element arrays 510 and arranging these lines in a staggered form in which they are arranged with shift in the direction which intersects with the scanning direction (y-direction).

Figure 13:
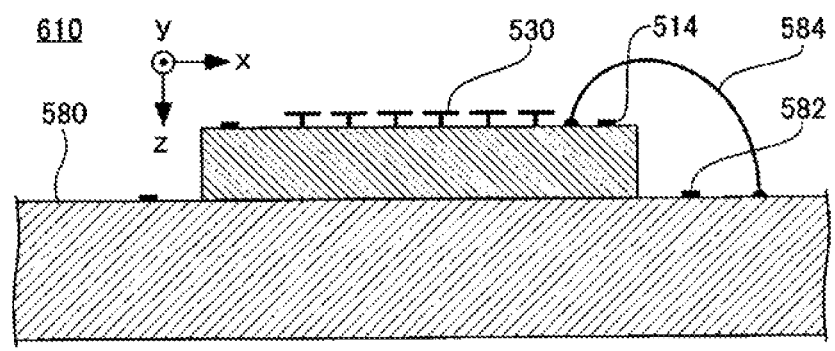
FIG. 13 is a schematic cross-sectional view of the spatial light modulation element array assembling body 610.

FIG. 13 is a figure explaining a method of positioning the spatial light modulation element array 510 in the laying out step (step S103). Prior to performing the laying out step, alignment marks 582, 514 are respectively provided in the module substrate 580 and the spatial light modulation element array 510. By using these alignment marks 582, 514, the spatial light modulation element arrays 510 are positioned in the module substrate 580 and the layout as shown in FIG. 12 can be formed.

On the module substrate 580, the alignment mark 582 which can be optically visually recognizable from the surface of the module substrate 580 is formed. The alignment mark may be an undulation, a groove, a step, etc. of the surface of the module substrate 580 formed by etching, etc. and may be a wiring, a pad, etc. formed on the surface of the module substrate 580.

Also, the alignment mark may be a pattern provided exclusively for the alignment mark that is a material to form a wiring, etc. Furthermore, it is preferable to form the alignment mark 582 on the same plane as the plane to implement the spatial light modulation element array 510. However, it is visually recognizable by an infrared camera, etc., even if it is provided inside or on the back surface of the module substrate 580.

Similarly, the alignment mark 514 is provided prior to the laying out step (step S103) also in the spatial light modulation element array 510. The alignment mark may be formed in the step of manufacturing the spatial light modulation element array 510, or it may be formed at another time after the spatial light modulation element array 510 is formed. The alignment mark 514 may be an undulation, a groove, a step, etc. formed on the surface of the array substrate 520 or may be the reflecting element 530, the post 540, a wiring, a pad, etc.

Also, it is preferable to form the alignment mark 514 on the plane that can be viewed from the same side as the alignment mark 582 on the module substrate 580 side when implementing the alignment mark 514 in the module substrate 580. However, it is visually recognizable by an infrared camera, etc. even if it is provided inside or on the back surface of the module substrate 580. Furthermore, one alignment mark 582 on the module substrate 580 may be also used for positioning of the plurality of spatial light modulation element arrays 510.

When implementing the spatial light modulation element array 510 in the module substrate 580, the spatial light modulation element array 510 can be positioned by matching relative positions of the above-described alignment marks 514, 582 with predetermined relative positions. Thus, the mutual position of the plurality of spatial light modulation element arrays 510 in the module substrate 580 can be a predetermined one by repeating the positioning for every spatial light modulation element array 510.

The laying out step (step S103) may include a wiring step of electrically coupling each of the spatial light modulation element arrays 510 with the module substrate 580. The spatial light modulation element array 510 and the module substrate 580 can be electrically coupled by, for example, a bonding wire 584.

Figure 14:
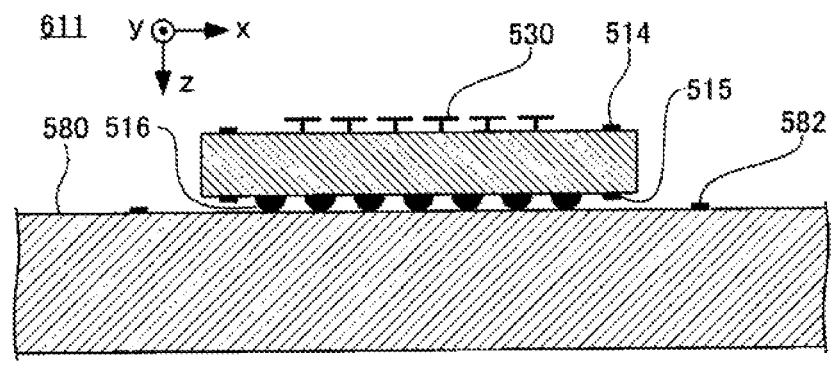
FIG. 14 is a schematic cross-sectional view of a spatial light modulation element array assembling body 611.

FIG. 14 is a figure showing an aspect of an implementation of the other spatial light modulation element array assembling body 611 for the module substrate 580. In the spatial light modulation element array assembling body 611 illustrated in the figure, the spatial light modulation element array 510 has a micro-bump 516 on a lower surface in the figure. Also, the spatial light modulation element array 510 has the alignment mark 515 used in positioning when flip-chip mounting the spatial light modulation element array 510 in addition to the alignment mark 514 formed on the same plane as the reflecting element 530, utilized when forming the reflecting element 530, etc.

Thereby, the implementation and wiring of the spatial light modulation element array 510 in the laying out step (step S103) can be collectively performed. Also, the packaging density of the spatial light modulation element array 510 in the module substrate 580 can be further improved, because the provision of a wiring pad around the spatial light modulation element array 510 can be omitted.

Figure 15:
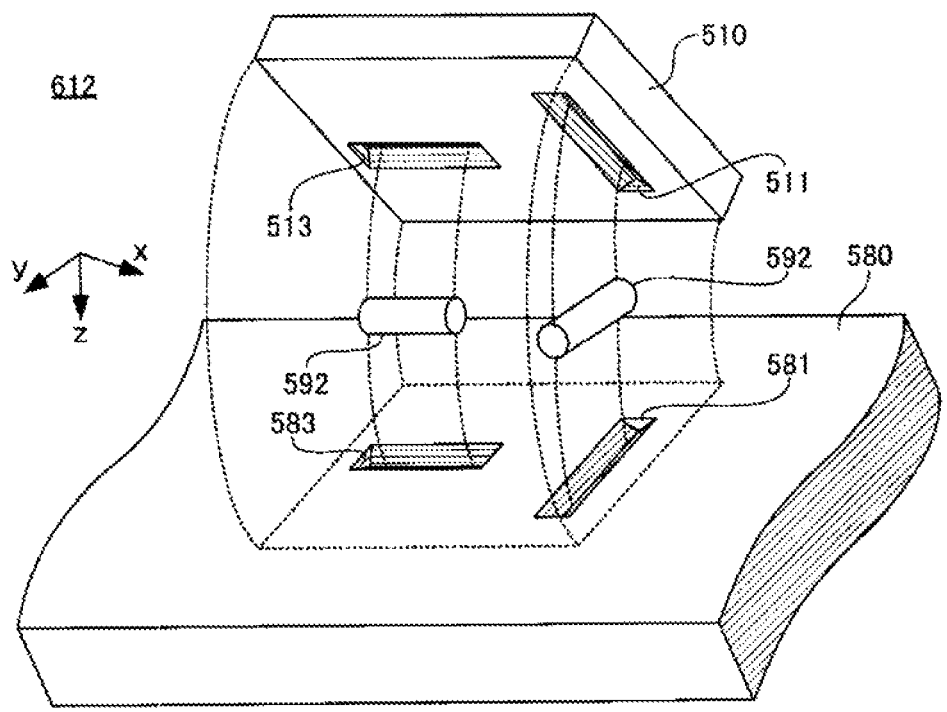
FIG. 15 is an exploded perspective view of a spatial light modulation element array assembling body 612.

FIG. 15 is an exploded perspective view explaining the other structure where the spatial light modulation element array 510 is positioned relative to the module substrate 580 and implemented in a spatial light modulation element array assembling body 612. In the spatial light modulation element array assembling body 612 illustrated in the figure, the spatial light modulation element array 510 is positioned by a mechanical structure without using the alignment marks 514, 582.

In the spatial light modulation element array assembling body 612, the module substrate 580 has on a surface a longitudinal groove 581 formed in the longitudinal direction in the figure and a transverse groove 583 formed in the lateral direction in the figure. On the surface of the module substrate 580, the longitudinal groove 581 and the transverse groove 583 are orthogonal to each other.

In the spatial light modulation element array assembling body 612, the spatial light modulation element array 510 has a longitudinal groove 511 formed in the longitudinal direction in the figure and a transverse groove 513 formed in the lateral direction in the figure on a lower surface in the figure. The longitudinal groove 511 and the transverse groove 513 in the spatial light modulation element array 510 correspond to the positions of the longitudinal groove 581 and the transverse groove 583 of the module substrate 580.

Furthermore, in the spatial light modulation element array assembling body 612, positioning members 592, each of which is cylindrical, are placed between the module substrate 580 and the spatial light modulation element array 510. The positioning members 592 are accommodated inside the longitudinal grooves 511, 581 and the transverse grooves 513, 583. For this reason, the length of the positioning member 592 is shorter than the lengths in the longitudinal direction of the longitudinal grooves 511, 581 and of the transverse grooves 513, 583.

Figure 16:
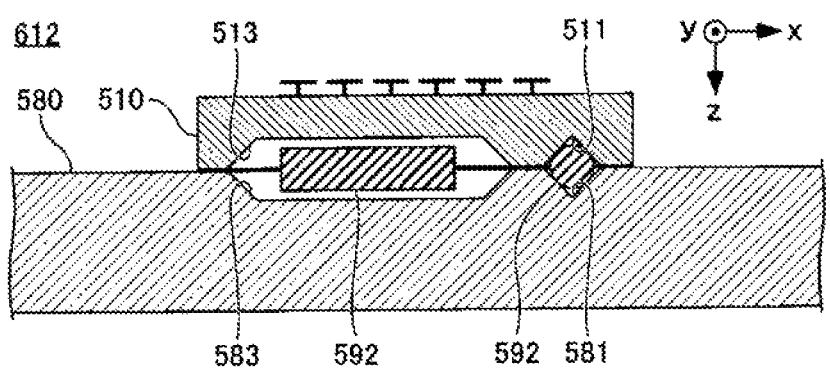
FIG. 16 is a cross-sectional view of the spatial light modulation element array assembling body 612.

FIG. 16 is a cross-sectional view of the spatial light modulation element array assembling body 612 having the structure shown in FIG. 15. As illustrated in the figure, the longitudinal grooves 511, 581 and the transverse grooves 513, 583 respectively have V-shaped cross-section shapes. For this reason, the cylindrical positioning members 592 respectively make line contacts inside the longitudinal grooves 511, 581 and the transverse grooves 513, 583 and uniquely determine the relative position of the module substrate 580 and the spatial light modulation element array 510.

Also, as shown in FIG. 15, the longitudinal grooves 511, 581 and the transverse grooves 513, 583 are orthogonal to each other. Thus, for the relative position of the module substrate 580 and the spatial light modulation element array 510, both the spacing and the tilt are positioned.

In the spatial light modulation element array assembling body 612, it is preferable that a gap remains between the module substrate 580 and the spatial light modulation element array 510 when the positioning member 592 is placed between them, and that the longitudinal grooves 511, 581 and the transverse grooves 513, 583 are formed at a depth that is enough to keep the both from directly contacting each other. Thereby, the positioning precision of the spatial light modulation element array 510 is reliant on the size precision of the longitudinal grooves 511, 581 and the transverse grooves 513, 583 as well as the positioning members 592.

The longitudinal grooves 511, 581 and the transverse grooves 513, 583 can be precisely formed by the anisotropic etching utilizing the photolithography technique. Also, for the positioning member, a ceramic round bar with a high shape precision can be used. Thus, the positioning precision of the spatial light modulation element array 510 relative to the module substrate 580 also increases. Also, by leaving a gap between the module substrate 580 and the spatial light modulation element array 510, the adhesive, etc. put between the both can be prevented from influencing the positioning precision.

As described above, the alignment marks 514, 582 which are optically visually recognizable may be provided on the spatial light modulation element array 510 and the module substrate 580 even if the structure is a structure which positions the spatial light modulation element array 510 by using the positioning members 592. Thereby, when positioning the spatial light modulation element array 510 on the module substrate 580, the operation of moving it to the vicinity of the mounting position can be facilitated.

Figure 17:
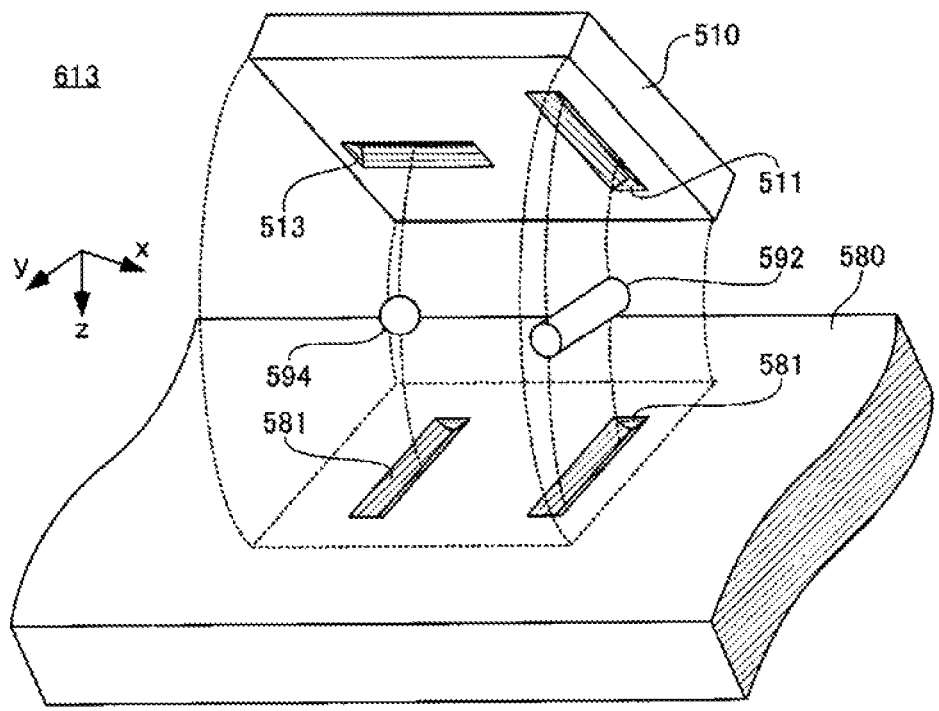
FIG. 17 is an exploded perspective view of a spatial light modulation element array assembling body 613.

FIG. 17 is an exploded perspective view explaining the other structure which positions the spatial light modulation element array 510 relative to the module substrate 580 and implements it in the spatial light modulation element array assembling body 613. Also in the spatial light modulation element array assembling body 613 illustrated in the figure, the spatial light modulation element array 510 is positioned by a mechanical structure without using the alignment marks 514, 582.

In the spatial light modulation element array assembling body 613, the spatial light modulation element array 510 has a longitudinal groove 511 formed in the longitudinal direction in the figure and the transverse groove 513 formed in the lateral direction in the figure on the lower surface in the figure as in the examples shown in FIG. 15 and FIG. 16. In the spatial light modulation element array 510, the longitudinal groove 511 and the transverse groove 513 are orthogonal to each other.

In the spatial light modulation element array assembling body 613, the module substrate 580 has a pair of longitudinal grooves 581 formed in the longitudinal direction in the figure and the transverse groove 583 formed in the lateral direction in the figure on the surface. The longitudinal grooves 581 are parallel to each other on the surface of the module substrate 580. Also, one of the longitudinal grooves 581 in the module substrate 580 is provided in a position corresponding to the longitudinal groove 511 of the spatial light modulation element array 510.

The other one of the longitudinal grooves 581 in the module substrate 580 is arranged in a position intersecting with the transverse groove 513 of the spatial light modulation element array 510, Furthermore, in the spatial light modulation element array assembling body 613, the cylindrical positioning member 592 and the spherical positioning member 594 are placed between the module substrate 580 and the spatial light modulation element array 510. The positioning member 592 is placed between the longitudinal groove 511 and the longitudinal groove 581. Also, the spherical positioning member 594 is placed between the longitudinal groove 581 and the transverse groove 513.

Figure 18:
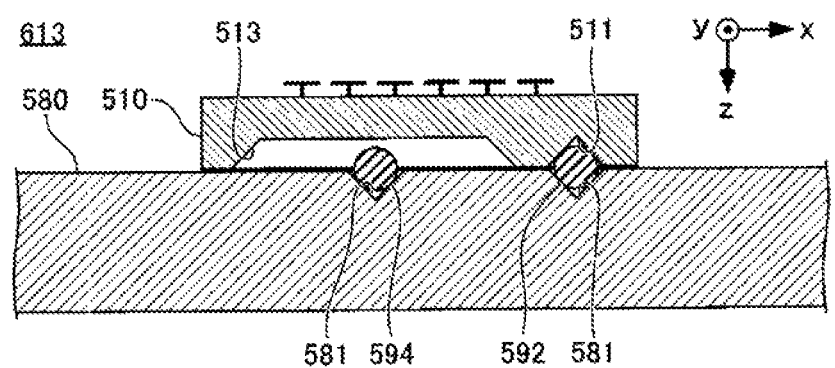
FIG. 18 is a cross-sectional view of the spatial light modulation element array assembling body 613.

FIG. 18 is a cross-sectional view of the spatial light modulation element array assembling body 613 having the structure shown in FIG. 17. As illustrated in the figure, the longitudinal grooves 511, 581 and the transverse groove 513 respectively have V-shaped cross-section shapes.

For this reason, the cylindrical positioning member 592 makes a line contact with the inner surface of the longitudinal grooves 511, 581 and uniquely determines the relative positions of the module substrate 580 and the spatial light modulation element array 510. Also, the spherical positioning member 594 makes a point contact with the inner surface of each groove in a position at which the transverse groove 513 of the spatial light modulation element array 510 and the longitudinal groove 581 of the module substrate 580 intersect and uniquely determines the spacing between the module substrate 580 and the spatial light modulation element array 510. Thereby, for the relative positions of the module substrate 580 and the spatial light modulation element array 510, both the spacing and the tilt are also positioned, also in the spatial light modulation element array assembling body 613.

It is preferable that a gap remains between the module substrate 580 and the spatial light modulation element array 510, and that the longitudinal grooves 511, 581 and the transverse grooves 513, 583 are formed at a depth that is enough to prevent the both from directly making contact, when the positioning members 592, 594 are sandwiched, also in the spatial light modulation element array assembling body 613. Thereby, the precision of the positioning of the spatial light modulation element array 510 is reliant on the size precision of the longitudinal grooves 511, 581 and the transverse grooves 513, 583 and the positioning member 592. Thus, the positioning precision of the spatial light modulation element array 510 relative to the module substrate 580 increases. Also, the adhesive, etc. that is placed between the both can be prevented from influencing the positioning precision by leaving a gap between the module substrate 580 and the spatial light modulation element array 510.

By applying the examples shown in FIG. 15 through FIG. 18, for example, a structure to position the spatial light modulation element array 510 in the module substrate 580 may be formed using 3 spherical positioning members. However, the parts count of the positioning member 594 increases, and concurrently, the workload of the groove processing of the spatial light modulation element array 510 and the module substrate 580 also increases.

Referring to FIG. 2 again, in manufacturing the spatial light modulation element module 500, a packaging step (step S104) is performed for the spatial light modulation element array assembling bodies 610, 611, 612, 613 formed by the laying out step (step S103) as described above. In the packaging step, the spatial light modulation element array assembling body 610 is accommodated in the package 630.

Figure 19:
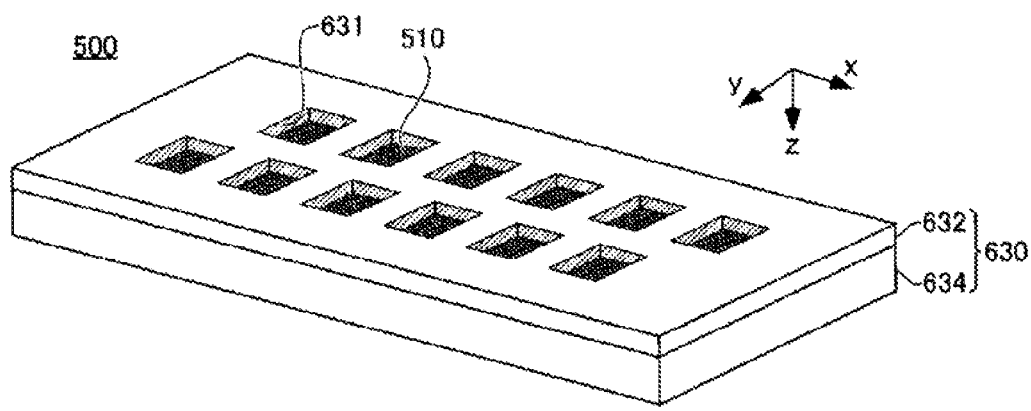
FIG. 19 is a perspective view of the spatial light modulation element module 500.

FIG. 19 is a perspective view of the spatial light modulation element module 500. The spatial light modulation element module 500 comprises a package 630 and the spatial light modulation element array assembling body 610. However, the spatial light modulation element array assembling body 610 is accommodated inside the package 630, so only the reflecting element 530 of the spatial light modulation element array 510 is exposed toward outside.

The package 630 has a container-shaped accommodating unit 634 and a lid portion 632 which seals the top surface of the accommodating unit 634. A plurality of window portions 631 are provided on the lid portion 632, and the reflecting element 530 of the spatial light modulation element array 510 emerges in the inner side of the window portion 631.

Figure 20:
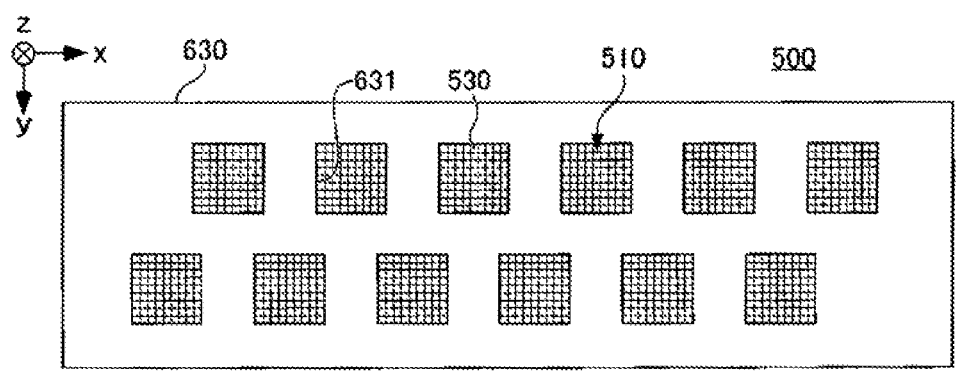
FIG. 20 is a plan view of the spatial light modulation element module 500.

FIG. 20 is a plan view of the spatial light modulation element module 500. In the spatial light modulation element module 500, the reflecting element 530 of each of the spatial light modulation element array 510 is positioned in the inner side of the window portion 631 provided on the lid portion 632 of the package 630 and exposed toward the outside. In other words, in each of the spatial light modulation element arrays 510, the portions other than the reflecting elements 530 are masked by the lid portion 632.

Thereby, the illumination light irradiated from outside of the spatial light modulation element module 500 is irradiated only in the region where the reflecting element 530 is provided and is protected from the illumination light by the package 630 in the portions other than the region. Thus, the CMOS circuit formed in the array substrate 520 is prevented from becoming degraded by the illumination light.

Figure 21:
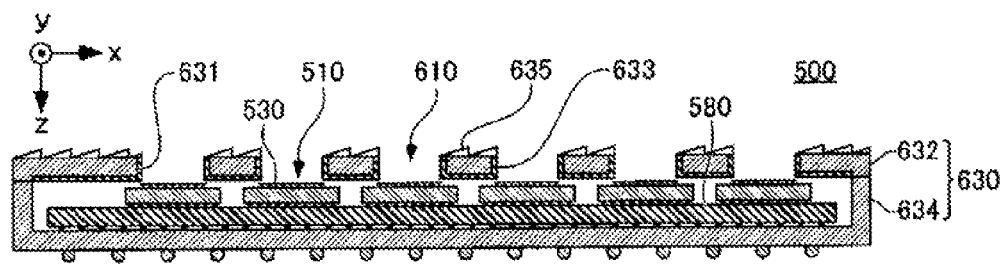
FIG. 21 is a cross-sectional view of the spatial light modulation element module 500.

FIG. 21 is a cross-sectional view of the spatial light modulation element module 500 and shows the Q-Q cross-section shown in FIG. 19. In the spatial light modulation element module 500, the spatial light modulation element array assembling body 610 is accommodated in the space inside the package 630, formed by the accommodating unit 634 and the lid portion 632. The package 630 can be formed by, for example, ceramics such as alumina.

The spatial light modulation element array assembling body 610 has the plurality of spatial light modulation element arrays 510 implemented in the module substrate 580. Each of the spatial light modulation element arrays 510 has many reflecting elements 530 which can be individually displaced.

In the spatial light modulation element module 500, a light shielding line 635 is formed on the top surface in the figure of the lid portion 632 of the package 630. The light shielding line 635 has a reflective surface having a saw-tooth cross-section which reflects an incident light in a different direction from the reflected light of the reflecting element 530 in the spatial light modulation element module 500. Thereby, the illumination light which is not irradiated on the reflecting element 530 exposed in the inner side of the window portion 631 and is irradiated on the lid portion 632 of the package 630, of the illumination light irradiated on the spatial light modulation element module 500, is reflected toward the optical path which is different from the reflected light of the reflecting element 530.

Thus, the rise in temperature of the spatial light modulation element module 500 by the illumination light is suppressed, and concurrently, the modulation precision of the modulated light reflected in the reflecting element 530 and emitted toward the outside can be increased. For the light shielding line, a blazed diffraction optical element and a diffraction grating, etc. may be used in addition to the saw-tooth reflective surface shown in the figure. Also, a member which absorbs an incident light or reflected light may be provided in place of the light shielding line 635.

Also, in the spatial light modulation element module 500, an antireflective portion 633 is provided in the inner side of the window portion 631 of the package 630 and the inner surface of the lid portion 632, etc. Thereby, the generation of stray light is prevented, and a pattern precision of the irradiated light output by the spatial light modulator is improved.

In the spatial light modulation element module 500 as described above, can maintain a high modulation precision for the long term, since each of the spatial light modulation element arrays 510 is protected by the package 630. Also, the maintenance of the exposure apparatus 100 is facilitated, since the whole package 630 can be exchanged in case the performance drops due to a long-term use.

Also, since the spatial light modulation element module 500 is formed by implementing the plurality of spatial light modulation element arrays 510, a partially degraded spatial light modulation element module 500 can be easily renewed by exchanging in units of the spatial light modulation element array 510. Thereby, the cost of the spatial light modulation element module 500 can be reduced, so the operative cost of an apparatus using the spatial light modulation element module 500 such as the exposure apparatus 100 can also be reduced.

The form of the package 630 is not limited to those illustrated in the figures. It is understood that the spatial light modulation element module 500 can be formed by the other package structure such as a metal package, a resin mold package.

Figure 22:
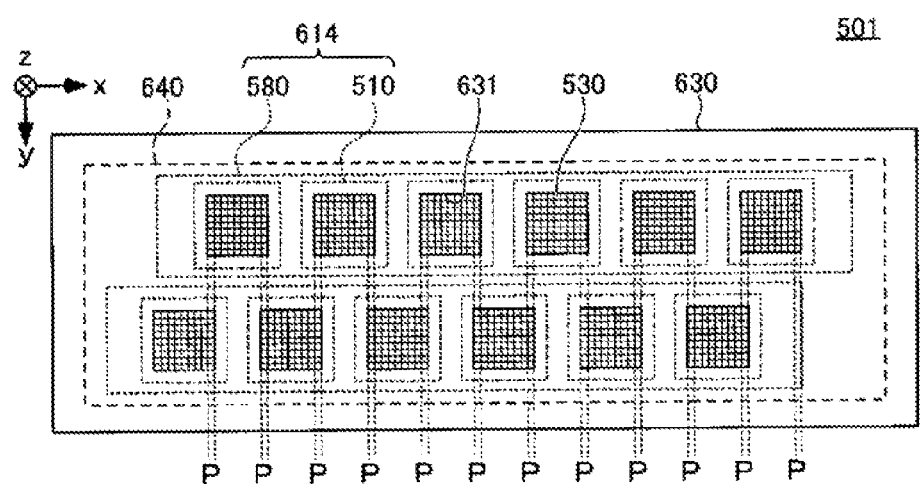
FIG. 22 is a plan view of the spatial light modulation element module 501.

FIG. 22 is a plan view of the other spatial light modulation element module 501. The spatial light modulation element module 501 comprises the package 630 and a plurality of spatial light modulation element array assembling bodies 614 accommodated inside the package 630. The spatial light modulation element array assembling body 610, furthermore, is accommodated in the package 630 in a state in which it is implemented in a large module substrate 640.

In the spatial light modulation element module 501, the spatial light modulation element array assembling body 614 comprises the module substrate 580 and the plurality of spatial light modulation element arrays 510 implemented in a row in the module substrate 580. Moreover, 2 slices of module substrates 580 in which a row of spatial light modulation element arrays 510 is implemented are prepared and are implemented in a larger module substrate 640.

In the large module substrate 640, a pair of spatial light modulation element array assembling bodies 614 is implemented by shifting in the longitudinal direction with each other. Thereby, the spatial light modulation element arrays 510 mounted on both of the spatial light modulation element array assembling bodies 614 make a staggered arrangement with each other. A point in common with the spatial light modulation element module 500 is that the reflecting elements 530 of each of the spatial light modulation element arrays 510 are exposed toward the outside from the window portions 631 of the package 630.

In the above-described examples, the module substrates 580 each of which implements a row of spatial light modulation element arrays 510 is further implemented in the large module substrate 640, and the spatial light modulation element arrays 510 are positioned. However, each of the module substrates 580 may be directly positioned within the package 630 by omitting the large module substrate 640.

While the present invention has been explained by using the embodiments as above, the technical scope of the present invention is not limited to the scope described in the above-described embodiments. It is apparent to persons skilled in the art that it is possible to add various alterations or improvements to the above-described embodiments. It is also apparent from the scope of the claims that the embodiments added with such alterations or improvements can be included in the description of the technical scope of the present invention.

The present invention is not limited to applications for an exposure apparatus for manufacturing a semiconductor device. For example, the present invention can also be broadly applied for an exposure apparatus for a display apparatus such as liquid crystal display elements formed in a square-shaped glass plate or plasma displays, and exposure apparatuses for manufacturing various devices such as imaging elements (CCD, etc.), micro machines, thin-film magnetic heads, and DNA chips. Furthermore, the present invention can also be applied for an exposure apparatus which manufactures a mask on which the mask patterns of various devices are formed (photomask, reticle, etc.) by using the lithography process. As above, a target object of exposure on which an energy beam is irradiated in the above-described embodiment is not limited to a wafer. It may be the other object such as a glass plate, a ceramic substrate, or mask blanks.

The semiconductor device is manufactured after a step of performing the function/performance design of the device, a step of forming a wafer from silicon material, a step of exposing a wafer via a deformable molding mask by the exposure apparatus of the above-described embodiments, a step of forming a circuit pattern such as etching, a step of assembling the device (including a dicing process, a bonding process, a packaging process), and a step of inspection.

In the above-described embodiment, a case in which the spatial light modulation element module of the present invention is used in the exposure apparatus has been explained. However, the embodiment is not limited to this, and it is possible to use the spatial light modulation element module in, for example, a projection image display apparatus such as a projector, and it is possible to use the spatial light modulation element module also in, for example, various applications such as an optical information processing apparatus, an electrostatic photographic printing apparatus, an optical switch used in optical communications, Switched Blazed Grating Device, or a plate setter used in the field of printing.

It should be noted that the operations, procedures, steps, and stages of each process performed by an apparatus, system, program, and method shown in the claims, specification, and diagrams can be performed in any order as long as the order is not particularly specified by "prior to," "before," or the like, and also, as long as the output from a previous process is not used in a later process. Even if the operation flow is explained using phrases such as "first" or "next" in the claims, specification, and diagrams, it does not necessarily mean that the process must be performed in this order.

What is claimed is:

1. A spatial light modulation element module comprising:
a plurality of combinations of a base member and a plurality of spatial light modulation element arrays, wherein
each of the plurality of spatial light modulation element arrays has a light modulation element which modulates and emits at least one of an intensity and a phase of an incident light,
the base member maintains the plurality of spatial light modulation element arrays in predetermined relative positions in bare chip states, and
the combinations are arranged with each other such that the plurality of spatial light modulation element arrays are in a staggered arrangement.

2. The spatial light modulation element module according to claim 1, wherein the plurality of spatial light modulation element arrays are in a staggered arrangement in at least one direction.

3. The spatial light modulation element module according to claim 2, wherein at least one reflecting element of one spatial light modulation element array and at least one reflecting element of another spatial light modulation element array adjacent to the one spatial light modulation element array are arranged in adjacent positions without a space or in an overlapping position, as viewed from a direction orthogonal to the at least one direction.

4. The spatial light modulation element module according to claim 1 wherein, each of the plurality of spatial light modulation element arrays has a micro-bump electrically connected to the base member on a surface opposite to the base member.

5. The spatial light modulation element module according to claim 1, further comprising a packaging unit which covers the base member and at least a portion of each of the plurality of spatial light modulation element arrays.

6. The spatial light modulation element module according to claim 5, wherein
the packaging unit has a mask unit in which an opening is provided in a region in which each of the plurality of spatial light modulation element arrays is arranged, and
the mask unit further has an antireflective structure including an absorber which absorbs an incident light or a reflected light.

7. The spatial light modulation element module according to claim 5, wherein
the packaging unit has a mask unit in which an opening is provided in a region in which each of the plurality of spatial light modulation element arrays is arranged, and
the mask unit includes any of a mirror, a diffraction grating, and a blazed diffraction optical element and further includes a structure which reflects an incident light toward an optical path which is different from a reflected light from a reflecting element.

8. A photolithographing apparatus to draw a light figure using the spatial light modulation element module according to claim 1.

9. An exposure apparatus to expose a semiconductor using the photolithographing apparatus according to claim 8.

10. A method of manufacturing a device including lithography process, wherein exposure is performed using the exposure apparatus according to claim 9 in the lithography process.

* * * * *